United States Patent [19]

Sansregret

[11] 4,291,318

[45] Sep. 22, 1981

[54] AMORPHOUS SILICON MIS DEVICE

[75] Inventor: Joseph L. Sansregret, Scotch Plains, N.J.

[73] Assignee: Exxon Research & Engineering Co., Florham Park, N.J.

[21] Appl. No.: 99,420

[22] Filed: Dec. 3, 1979

[51] Int. Cl.³ .......................................... H01L 45/00
[52] U.S. Cl. ......................................... 357/2; 357/15; 357/30; 357/6
[58] Field of Search ............................ 357/2, 15, 30, 6

[56] References Cited

U.S. PATENT DOCUMENTS

| | | | |
|---|---|---|---|
| 4,064,521 | 12/1977 | Carlson | 357/2 |
| 4,117,506 | 9/1978 | Carlson | 357/30 |
| 4,142,195 | 2/1979 | Carlson et al. | 357/15 |
| 4,163,677 | 8/1979 | Carlson | 136/89 |
| 4,166,919 | 9/1979 | Carlson | 136/89 CL |
| 4,196,438 | 4/1980 | Carlson | 357/15 |
| 4,200,473 | 4/1980 | Carlson | 136/89 |

Primary Examiner—Martin H. Edlow
Attorney, Agent, or Firm—Paul E. Purwin

[57] ABSTRACT

The present invention relates to an amorphous silicon MIS device having an insulating oxide formed by the chemical oxidation of the silicon surface. A process comprising etching the silicon surface followed by a treatment of the etched surface in a sulfur based oxidant forms a controlled thickness oxide layer, useful in modifying the junction forming characteristics of the semiconductor and additionally stabilizing the semiconductor properties of the photoconductive amorphous silicon.

1 Claim, 1 Drawing Figure

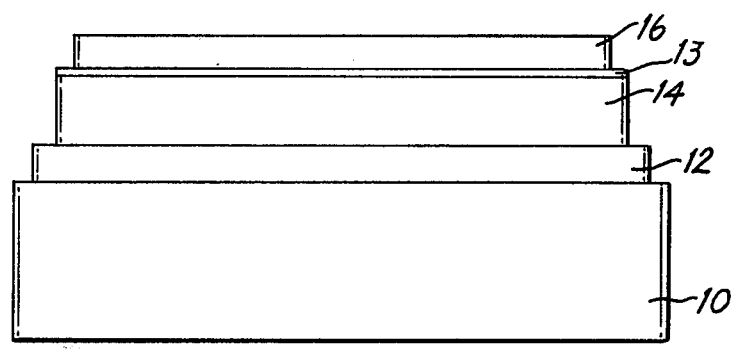

AMORPHOUS SILICON MIS DEVICE

FIELD OF THE INVENTION

The present invention relates to amorphous silicon semiconductor devices and particularly to such devices having a chemically grown interfacial oxide layer which alters the junction characteristics of the device.

BACKGROUND OF THE INVENTION

The use of an insulating layer for altering the junction forming characteristics of semiconductor materials is well known in the art of crystalline semiconductors such as single crystal silicon. A thin insulating oxide layer is generally interposed between semiconductor materials to alter the surface state of the adjoining materials, modifying the electronic band bending and the associated space charge distribution of the semiconductor junction. Typically, the oxide layer is either grown from the surface of the semiconductor or deposited onto the semiconductor from an extrinsic source. The term "grown" collectively represents the varied techniques for oxidizing the surface region of the semiconductor material. In specialized electronic applications, the thickness of the oxide layer is limited to below about 50 Angstroms. The thin oxide layer is sufficient to alter the material's surface states yet concurrently permit substantial conduction by tunneling means for an appropriately baised device. The term tunneling, as used herein and known to those of the art, refers to the ability of charge carriers to pass through a narrow junction region to allowable energy levels on the far side of the junction even though these charge carriers have insufficient energy to surmount the barrier formed at the MIS junction. In other applications thicker oxide layers have been used in field effect devices and the like.

In general, the controlled growth or deposition of insulating oxide layers on semiconductor materials such as single crystal silicon has greatly extended semiconductor technology.

The present invention teaches a technique for controlled chemical growth of an oxide layer onto a relatively new semiconductor material photoconductive amorphous silicon. Amorphous silicon MIS devices, as detailed herein, not only benefit from the junction modifying characteristics of the insulator interface, but also demonstrate a substantially increased stability of electronic properties.

PRIOR ART

The fabrication process for photoconductive amorphous silicon is known in the art. Summarily stated, there are two general fabrication techniques, glow discharge decomposition of silane and sputtering in a partial pressure of hydrogen.

Numerous device forming techniques have been demonstrated in the art. This device structure, however, is generally one of four; P-N junctions, hetro-junctions, P-I-N junctions or Schottky Barriers.

In a technical publication entitled *The Interfacial Layer in MIS Amorphous Silicon Solar Cells* J. Appl. Physics 50 (1), Jan. 1979, McGill et al disclose an amorphous silicon device having an interfacial oxide layer comprising $TiO_2$ vacuum evaporated onto the amorphous silicon semiconductor. In contrast, the present invention teaches the controlled chemical oxidation of the surface of the amorphous silicon semiconductor to form the insulating layer.

SUMMARY OF THE INVENTION

The present invention teaches a technique for controlled chemical oxidation of thin films of photoconductive amorphous silicon. An insulating layer of oxide is grown onto a surface of the amorphous silicon film by etching the semiconductor surface, whereafter the etched surface is contacted with a sulfur based oxidizing agent. The growth of the oxide film thickness is controlled by the concentration, temperature and duration of exposure to the sulfur based acid.

Amorphous silicon semiconductor devices having an interfacial oxide layer, grown in accordance with the present invention, display modified junction characteristics and increased stability of basic electronic properties.

DESCRIPTION OF THE DRAWINGS

The singular drawing is a cross sectional view of an amorphous silicon semiconductor device having an interfacial oxide layer produced in accordance with the present invention.

DETAILED DESCRIPTION OF THE INVENTION

Referring to the drawing, substrate 10 comprises a physically supportive material capable of withstanding processing temperatures in excess of about 400° C. A major surface of substrate 10 is preferably free of surface discontinuities of the order of one micron or greater to avoid forming pinholes in overlying thin films.

In one embodiment, substrate 10 comprises a material which is known to form an ohmic contact to amorphous silicon such as nichrome for example. The term ohmic contact is used in the art to define the ability of an electrode to form a substantially nonblocking contact to a semiconductor material, non-preferentially extracting or injecting holes or electrons. Alternatively, a layer 12 comprising a material forming the above described ohmic contact may be interposed between substrate 10 and the amorphous silicon layer. In a preferred embodiment, layer 12 comprises a thin film of nichrome sputter deposited onto a major area surface of a borosilicate glass substrate.

As described earlier, the deposition of photoconductive amorphous silicon is generally known to those of the art. Alternate techniques of glow discharge decomposition of silane or sputtering from a silicon containing target in the presence of a partial pressure of hydrogen are known to produce photoconductive hydrogenated amorphous silicon. Photoconductive amorphous silicon is generally characterizable as having an intrinsic dark bulk conductivity of between about $10^{-6}\ (\Omega-cm)^{-1}$ and about $10^{-10}\ (\Omega-cm)^{-1}$ and a light conductivity of between about $10^{-4}\ (\Omega-cm)^{-1}$ and $10^{-3}\ (\Omega-cm)^{-1}$ when irradiated with 100 mW of white light.

In one embodiment of the present invention, silicon layer 14 is vacuum deposited by means of a radio frequency (hereinafter RF) sustained glow discharge decomposition of silane, ($SiH_4$). An initial region 13 contiguous to the ohmic electrode, may preferably be doped N+ to insure the ohmicity of the contacting electrode. The addition of phosphine gas with the phosphine to silane ratio ranging from about 3 to 1000 to 3 to 100 will dope the deposition of amorphous silicon N+.

The initial region 13 may extend between about 50 Å and 500 Å into the body of the amorphous silicon layer after which the dopant gas supply is deleted and the deposition proceeds with the decomposition of pure silane to form intrinsic amorphous silicon.

Typically, the deposition parameters for the glow discharge decomposition of silane include providing a vacuum chamber evacuated to a pressure below about $10^{-5}$ torr. A partial pressure of silane, $SiH_4$, ranging from about 30 millitorr to about 50 millitorr, backfills the evacuated chamber, whereafter the partial pressure of silane is maintained by controlling the input flow rate of silane at about 10 cc/min while concurrently throttling the pumping speed of the evacuating system. An RF power supply is capacitively coupled to the gas content of the vacuum chamber by appropriately spaced parallel plate electrodes. This well known technique of coupling RF energy to an ionizable gas media is utilized to decompose the silane, depositing an amorphous silicon film containing hydrogen. As known in the art, the substrate to be coated may either be held contiguous to, or be in the vicinity of the anode electrode. Also known to those of the art is the requirement that the substrate be heated during the deposition. Typically the substrate will be maintained at a temperature between about 250° C. and about 350° C., dependant upon the accompanying deposition parameters. At an RF frequency of about 13.56 MHz and an input power level ranging from about 60 watts to about 80 watts, a film thickness between about 1 micron and about 3 microns may be deposited between about 40 minutes and about 120 minutes.

A substantially similar technique for glow discharge decomposition of silane substitutes a DC power source for the discharge sustaining power supply. The substrate to be coated is held contiguous to the cathode electrode which is sustained at a temperature of between about 250° C. and about 350° C. The DC power source supplies a potential of between about 700 volts and 800 volts between the anode and cathode electrode. A partial pressure of silane is maintained between about 800 millitorr and about 850 millitorr. These deposition parameters typically produce an amorphous silicon film ranging in thickness from about 1 micron to about 5 microns in a time period of about 10 minutes.

A further alternative for depositing amorphous silicon is reactive sputtering in a partial pressure of hydrogen. In one embodiment, substrates of borosilicate glass which have been previously coated with a nichrome layer are loaded into a vacuum system which is then pumped to a base pressure of about $5 \times 10^{-7}$ torr. Argon is then throttled through the system to achieve a steady state partial pressure of between about 5 and about 15 millitorr. Hydrogen is also throttled through the system to establish a steady state partial pressure of between about 0.25 and about 1.0 millitorr. The substrates are maintained at a temperature of about 200° C. to about 300° C. during deposition and power densities are maintained at about 1-2 watts per cm² of cathode. Typically, a one micron thick film is deposited between about 40 minutes and about 60 minutes. As described for the previous glow decomposition techniques, extrinsic dopants such as phosphine, diborane or similar known doping gases may be introduced into the vacuum chamber during the deposition to alter the semiconductor characteristics for particular desired device configurations.

The above described deposition techniques for producing thin film photoconductive amorphous silicon are generally known in the art and are included to illustrate several of the variant deposition techniques for producing this material.

Semiconductor layer 14 is then subjected to an etching process which comprises contacting the surface of layer 14 with a solution of hydrofluoric acid in water. Alkali metal hydroxides such as NaOH can also be used.

The etching of the silicon provides a standard surface for the subsequent oxide growth. The term standard surface, as used herein, denotes a surface whose chemical composition is approximately that of the bulk material and is substantially free of other chemical compounds such as oxides. The etching duration, solution concentration and temperature are interrelated. Typically, the etchant concentration will range from 27 Molar (hereinafter abbreviated as M) to about 12M; the temperature of the etching process will range from about 18° C. to about 30° C. and the duration of the etching from about 1 minute to about 5 minutes.

In a preferred embodiment, the silicon layer is immersed in an 18.4 M. hydrofluoric acid solution maintained about 20° C. for a period of about 1 minute.

A chemical oxidation of the etched surface comprises contacting the silicon surface with a sulfur based oxidant for a time sufficient to form an oxide layer of the desired thickness. In one embodiment, the etched silicon layer is immersed in a solution of sulfuric acid in water having a concentration ranging from about 5 M to about 17 M. The temperature of the acid solution is maintained between about 50° C. and about 125° C. An insulating oxide film 13 of $SiO_x$, where x varies from 1 to 2, having a thickness of between about 10 and about 50 Angstroms is formed in about 5 to about 20 minutes. It is believed that the oxidation process follows the reaction path:

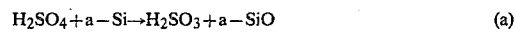  (a)

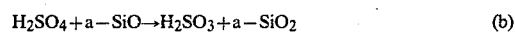  (b)

Sulfuric is preferred over other oxidizing acids such as nitric because it is a less strongly oxidizing agent and with a slower rate of oxidation, thin oxide layers can be more accurately grown. The oxidized film is then rinsed, dried and subjected to junction forming processes, known to those of the art. In one embodiment, a semi-transparent metal 16 which forms a Schottky Junction to amorphous silicon is deposited onto the oxidized surface along with a comparative untreated surface. An analysis of the junction characteristics indicates a substantial barrier modification as compared to known amorphous silicon junctions. When illuminated with light, the MIS, metal-insulator-semiconductor, and MS, metal-semiconductor, devices will exhibit similar values of short circuit current, but the MIS exhibits a higher open circuit voltage. The MIS device is also characterized by a lower reverse saturation current than the MS device.

In a further embodiment, the oxide samples are annealed in vacuum ovens at temperatures ranging from 200° C. to just below the recrystallization temperature of amorphous silicon.

To assist one skilled in the art, the following examples detail several embodiments of the present invention:

EXAMPLE 1

A plurality of borosilicate glass substrates, having a major surface virtually free of protrusions of the order of 1 micron or greater, were scrupulously cleaned to remove foreign matter. The substrates were transferred to a conventional sputtering system where their major surface was coated with a 1000 Å layer of nichrome, a metal alloy known to form an ohmic contact to amorphous silicon and particularly to amorphous silicon doped N+. The coated substrates were transferred to a vacuum deposition chamber adapted to provide glow discharge decomposition of silane in the deposition of photoconductive amorphous silicon. The deposition apparatus includes a pyrex bell jar about 30 cm high and about 15 cm in diameter held in vacuum contact to a stainless steel base plate. A pumping station comprising selectably alternative pumping means of mechanical pumping and diffusion pumping is utilized to evacuate the deposition chamber to pressures below about $10^{-5}$ torr or lower. Pumping speed is controlled by selectively varying the opening and closing of an aperture between the pumping station and the deposition chamber. An cathode electrode comprising a 7.6 cm diameter circular disk of stainless steel, contained a plurality of electro-resistive heating elements embedded within the electrode. The heaters are connected to a conventional temperature controller, capable of maintaining a relatively constant ($\pm 2°$ C.) temperature of the electrode. The substrates may be secured to the heater/cathode electrode by simple mechanical means so long as thermal contact is assured between the cathode electrode and the electrodes on the substrate. A second electrode, the anodic electrode, of similar size and composition is positioned parallel to the cathode electrode and having an inter-electrode spacing of about 2.5 cm. After evacuating the deposition chamber, CCD grade silane is bled into the chamber. In a preferred embodiment, silane is bled into the chamber while concurrently pumping to evacuate same, purging the chamber of residual atmospheric gases. Gaseous silane, $SiH_4$ containing about 1% phosphene, $PH_3$, is bled into the evacuated deposition chamber. A gas mixing and control system, constructed by Navtek Corp., provides precise mixing and control of gas flow rates. The initial gas flow mixture of silane and phosphene was regulated at 10 standard cm³/min. The pumping speed was regulated to provide a deposition chamber pressure of about 850 millitorr. Radio frequency (R.F.) power supply is connected in power supplying relation to the anode and cathode electrode respectively. A power density of about 1 watt per cm² is applied to the cathode electrode. The plasma between the electrodes both decomposes and ionizes the gas content of the chamber in a conventional glow discharge manner. After a deposition period of about 45 seconds which deposits a phosphine doped N+ layer of amorphous silicon about 700 Å in thickness, the supply of phosphine was removed and the system was effectively purged to remove any residual $PH_3$. Pure silane is then fed into the system at a controlled flow rate of about 10 standard cm³/min. The deposition of intrinsic amorphous silicon continues for a period of about 10 minutes to deposit an intrinsic layer about 10 microns in thickness. The deposition system was allowed to cool and was then backfilled to atmospheric pressure with inert gas. Several of the samples were set aside under cover of an inert gas to serve as comparison standards. The remaining samples were then etched in a solution of hydrofluoric acid in water having an acid concentration of about 18.4 molar. The acid etching bath was maintained at a temperature of about 18° C. After an etching period of about one minute, the samples were rinsed in distilled deionized water and blown dry in argon. The samples were then transferred to oxidizing baths containing 5.9 molar solution of $H_2SO_4$ in water. The several samples were subjected to variant durations and temperatures of oxidation outlined in Table 1.

TABLE 1

| Sample | Temperature | Time in Bath (min) |
|---|---|---|
| A | 18° C. | 5 |
| B | 18° C. | 60 |
| C | 65° C. | 5 |
| D | 109° C. | 5 |
| E | 109° C. | 15.0 |

All samples, including those reserved for comparison standards, were transferred to a conventional vacuum system where a semi-transparent layer of about 50 Å of palladium was deposited by thermal evaporation onto all samples which is known to form a Schottky junction to amorphous silicon.

Samples D & E were then placed in a vacuum oven and annealed for about 30 minutes at a temperature of about 200° C.

The junction characteristics were obtained and compared for each cell including both dark and illuminated current-voltage measurements. The results of these measurements are outlined in Table 2.

TABLE 2

| Sample | $I_{sc}$ | $V_{oc}$ |
|---|---|---|
| A | $3.8 \times 10^{-5}$ A | .40V |
| B | $4.05 \times 10^{-5}$ A | .40V |
| C | $4.1 \times 10^{-5}$ A | .58V |
| D | $4.2 \times 10^{-5}$ A | .60V |
| E | $3.9 \times 10^{-5}$ A | .60V |
| D (annealed) | $4.2 \times 10^{-5}$ A | .69V |
| E (annealed) | $4.1 \times 10^{-5}$ A | .69V |

The samples were then stored in room air for about 8 weeks whereafter the above described examples were reevaluated. The samples having the oxide layer remained substantially unchanged whereas the comparison standards, not having the chemically grown oxide, experienced a substantial decrease in open circuit voltage and loss of photovoltaic activity within about twenty-four hours following palladium deposition. It is believed that this loss of photovoltaic activity results from chemical reaction of the palladium with the hydrogen of the amorphous silicon to form palladium hydride which is known to have a lower work function than palladium. A lower work function contact would result in a loss of photovoltaic activity and lower open circuit voltages. The oxide layer is believed to act as a diffusion barrier preventing reaction of palladium and hydrogen with subsequent loss of photovoltaic activity.

EXAMPLE 2

Samples which were produced in a manner substantially identical to that set forth in Example 1 were etched for 60 sec in an 18.4 M solution of hydrofluoric acid in water. The acid etching bath was maintained at 18° C. The samples were then rinsed in deionized water and blown dry in nitrogen. The samples were then transferred to oxidizing bath consisting of 0.1 N solution of $Na_2S_2O_5$ in deionized water. The oxidizing bath was maintained at 75° C. and different samples were immersed in the bath for varying lengths of time as outlined in Table 3.

TABLE 3

| Sample | Time | Voc | $I_{sc}$ |
| --- | --- | --- | --- |
| F | 5 min | .57V | $2.5 \times 10^{-5}$ A |
| G | 15 min | .47V | $2.4 \times 10^{-5}$ A |

The samples were then metallized with palladium as in Example 1 and were characterized by light and dark current-voltage measurements. The results of these measurements are summarized in Table 3. A sample not subjected to surface oxidation showed $V_{oc}=0.40$ V, substantially lower than the open circuit voltage realized by the MIS device of the present invention.

What is claimd is:

1. An amorphous silicon semiconductor device having increased open circuit voltage and photovoltaic longevity, said device comprising:
   a substrate;
   a layer of amorphous silicon containing hydrogen deposited on said substrate and having a region of SiOx where x is defined by the relationship $1 \leq x \leq 2$, said SiOx layer formed by first etching a surface region of the amorphous silicon to provide a normal surface than oxidizing said normal surface with a sulfur based oxidant;
   a metallic layer, contiguous to said oxide and forming a junction to said amorphous silicon, SiOx or the combination thereof.